(12) United States Patent
Hong et al.

(10) Patent No.: US 10,790,122 B2
(45) Date of Patent: Sep. 29, 2020

(54) PLASMA PROCESSING APPARATUS AND METHOD OF MANUFACTURING SEMICONDUCTOR DEVICE USING THE SAME

(71) Applicant: SAMSUNG ELECTRONICS CO., LTD., Suwon-si, Gyeonggi-Do (KR)

(72) Inventors: Jung-Pyo Hong, Seoul (KR); Jong-Woo Sun, Hwaseong-si (KR); Jung-Mo Sung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 283 days.

(21) Appl. No.: 15/907,328

(22) Filed: Feb. 28, 2018

(65) Prior Publication Data

US 2019/0074165 A1 Mar. 7, 2019

(30) Foreign Application Priority Data

Sep. 1, 2017 (KR) .................. 10-2017-0111933

(51) Int. Cl.
*H01J 37/32* (2006.01)
*H01L 21/67* (2006.01)
*H01L 21/683* (2006.01)

(52) U.S. Cl.
CPC ........ *H01J 37/32642* (2013.01); *H01J 37/32* (2013.01); *H01J 37/321* (2013.01); *H01J 37/3211* (2013.01); *H01J 37/3266* (2013.01); *H01J 37/32541* (2013.01); *H01J 37/32697* (2013.01); *H01J 37/32715* (2013.01); *H01L 21/67103* (2013.01); *H01L 21/67109* (2013.01); *H01L 21/6831* (2013.01);
(Continued)

(58) Field of Classification Search
CPC .... H01J 37/32642; H01J 37/32; H01J 37/321; H01J 37/3266; H01J 37/32715; H01J 37/32697; H01J 37/32541; H01J 37/3211; H01J 2237/334; H01J 2237/3321; H01J 2237/049; H01J 37/32183; H01J 37/32669; H01J 37/32174; H01J 37/32091; H01L 21/67103; H01L 21/6831; H01L 21/67109; H01L 21/6833; H01L 21/67069
USPC ....................................... 118/723 AN, 723 E
See application file for complete search history.

(56) References Cited

U.S. PATENT DOCUMENTS 5,435,886 A * 7/1995 Fujiwara ............... H01J 37/026
　　　　　　　　　　　　　　　　　　　　　　　204/298.38
6,673,199 B1 1/2004 Yamartino et al.
(Continued)

FOREIGN PATENT DOCUMENTS

JP 　2005-068526 A 　3/2005
JP 　　5546573 A 　5/2014
(Continued)

*Primary Examiner* — Ram N Kackar
(74) *Attorney, Agent, or Firm* — Volentine, Whitt & Francos, PLLC

(57) ABSTRACT

A plasma processing apparatus includes a process chamber having an inner space, an electrostatic chuck in the process chamber and to which a substrate is mounted, a gas injection unit to inject a process gas into the process chamber at a side of the process chamber, a plasma applying unit to transform the process gas injected into the process chamber into plasma, and a plasma adjusting unit disposed around the electrostatic chuck and operative to adjust the density of the plasma across the substrate.

20 Claims, 18 Drawing Sheets

(52) U.S. Cl.
CPC .... *H01L 21/6833* (2013.01); *H01J 37/32183* (2013.01); *H01J 2237/049* (2013.01); *H01J 2237/334* (2013.01); *H01J 2237/3321* (2013.01); *H01L 21/67069* (2013.01)

(56) References Cited

U.S. PATENT DOCUMENTS

| | | | |
|---|---|---|---|
| 7,572,737 B1* | 8/2009 | Dhindsa | H01J 37/32623 216/68 |
| 2003/0201069 A1* | 10/2003 | Johnson | H01J 37/32082 156/345.43 |
| 2006/0086458 A1* | 4/2006 | Kim | H01J 37/32477 156/345.1 |
| 2008/0006205 A1 | 1/2008 | Keil et al. | |
| 2012/0031560 A1 | 2/2012 | Koshimizu | |
| 2013/0112666 A1 | 5/2013 | Koshiishi et al. | |
| 2014/0048016 A1* | 2/2014 | Scarsbrook | C23C 16/274 118/723 MW |
| 2015/0187615 A1 | 7/2015 | Daugherty et al. | |
| 2015/0279623 A1 | 10/2015 | Liang | |
| 2017/0365450 A1* | 12/2017 | Bi | H01J 37/32862 |

FOREIGN PATENT DOCUMENTS

| | | |
|---|---|---|
| KR | 10-2009-0037343 A | 4/2009 |
| KR | 10-2014-0102799 A | 8/2014 |

\* cited by examiner

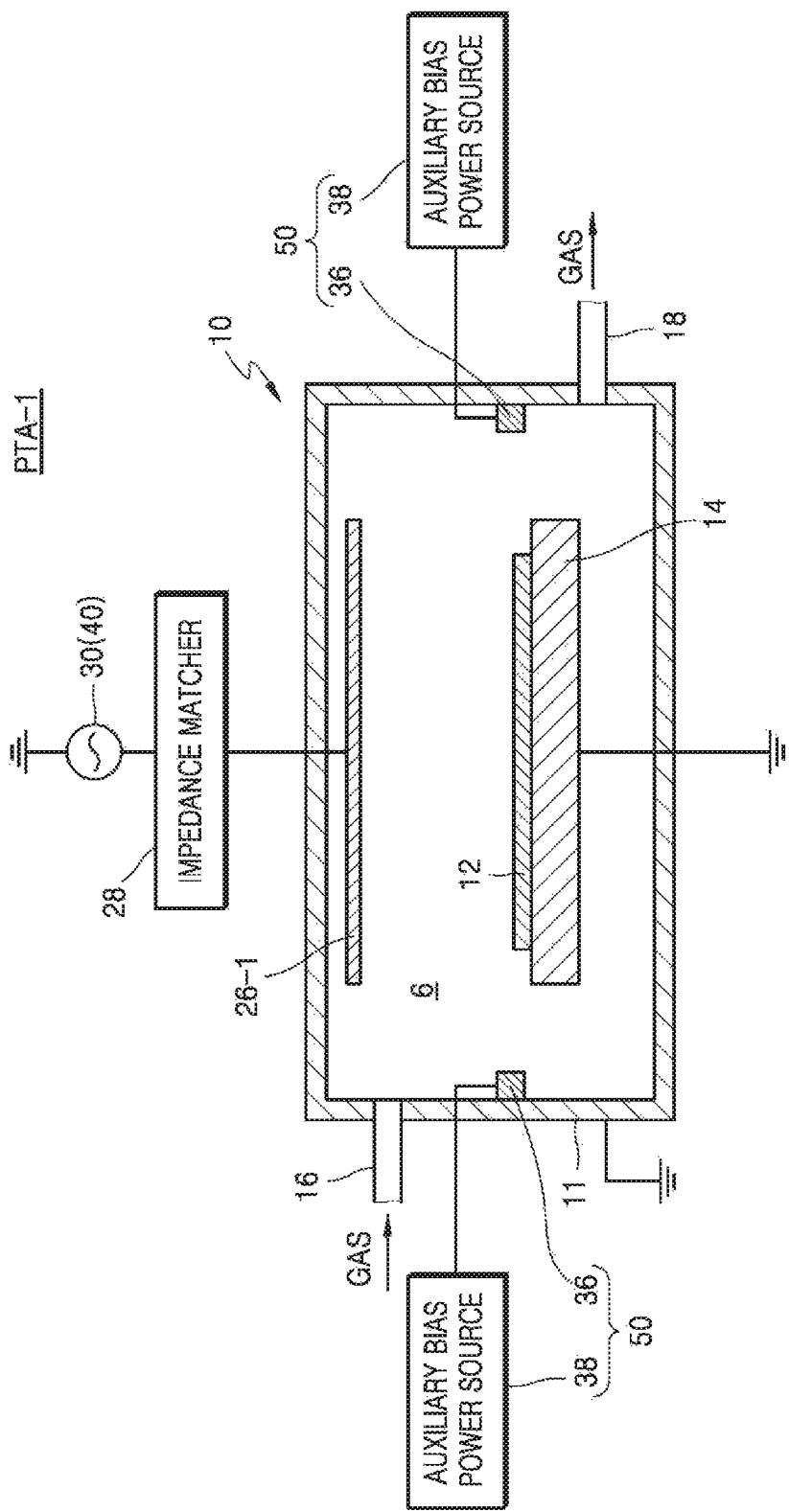

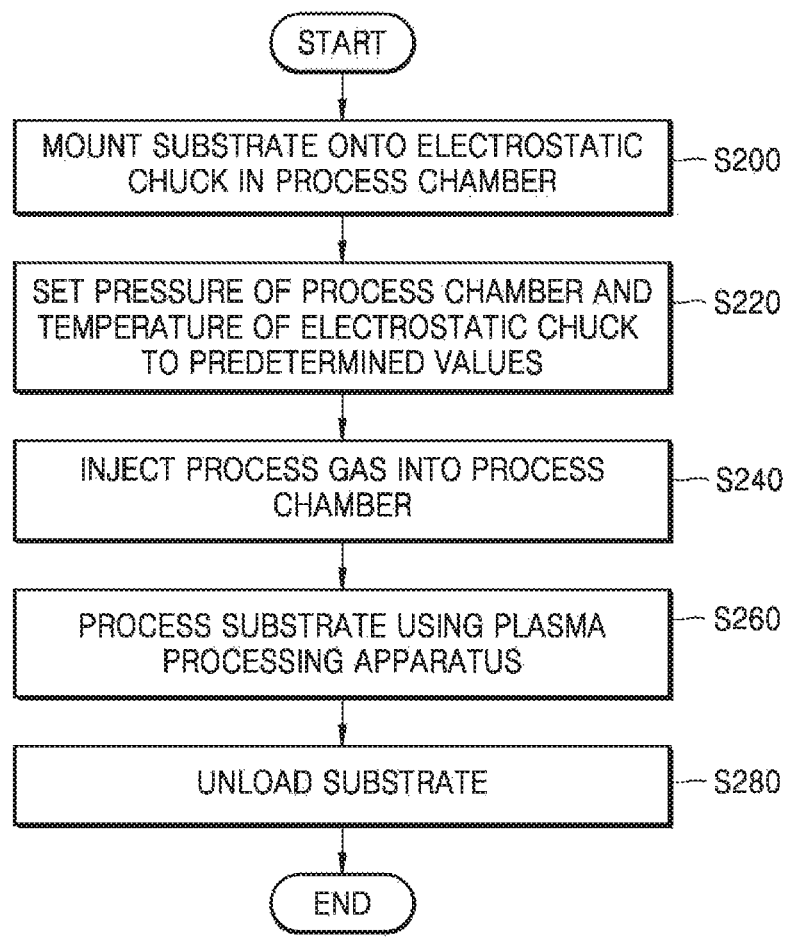

PLASMA PROCESSING APPARATUS AND METHOD OF MANUFACTURING SEMICONDUCTOR DEVICE USING THE SAME

PRIORITY STATEMENT

This application claims the benefit of Korean Patent Application No. 10-2017-0111933, filed on Sep. 1, 2017, in the Korean Intellectual Property Office, the disclosure of which is hereby incorporated by reference in its entirety.

BACKGROUND

The inventive concept relates to a semiconductor manufacturing apparatus and to a method of manufacturing a semiconductor device using the same. More particularly, the inventive concept relates to a plasma processing apparatus and to a method of manufacturing a semiconductor device using the same.

Electronic devices, such as semiconductor devices, LCD devices, LED devices, and the like, may be manufactured using a plasma processing apparatus. Examples of the plasma processing apparatus include a plasma film deposition apparatus and a plasma etching apparatus. However, it is difficult to precisely control plasma in a processing chamber when the plasma processing apparatus is used.

SUMMARY

According to an aspect of the inventive concept, there is provided a plasma processing apparatus including a process chamber having an interior in which plasma processing takes place, a substrate support disposed in the process chamber and including an electrostatic chuck having a support surface dedicated to support a substrate to be plasma processed, a gas injector open to the interior of the process so as to inject a process gas into the process chamber, a plasma generator that transforms the process gas injected into the process chamber into plasma, and a plasma adjusting unit including a body comprising ferromagnetic material disposed radially outwardly of the support surface of the electrostatic chuck at substantially the same level as the support surface and an auxiliary power source electrically coupled to the body.

According to another aspect of the inventive concept, there is provided a plasma processing apparatus including a process chamber having an interior in which plasma processing takes place, a substrate support comprising an electrostatic chuck disposed in a lower part of the process chamber and including an electrostatic chuck having a support surface dedicated to support a substrate to be plasma processed, a bias power source electrically connected to the electrostatic chuck, a gas injector open to the interior of the process so as to inject a process gas into the process chamber, a high frequency electrode unit disposed in an upper part of the process chamber and comprising at least one electrode, a high frequency power source electrically connected to the at least one electrode of the high frequency electrode unit, and a plasma adjusting unit including a body comprising ferromagnetic material disposed radially outwardly of the support surface of the electrostatic chuck at substantially the same level as the support surface and an auxiliary power source electrically coupled to the body, and a control unit to which the bias power source, high frequency power source and auxiliary power source are electrically connected and operative to adjust a distribution of density of the plasma in the process chamber.

According to another aspect of the inventive concept, there is provided a plasma processing apparatus including a process chamber having an inner space, a gas injection unit to inject a process gas into a side of the process chamber, a high frequency electrode unit on a top side of the process chamber and to which high frequency power is supplied through a high frequency antenna; an electrostatic chuck located away from the high frequency electrode unit, on which a substrate is mounted in a lower side of the process chamber, and to which bias power is applied, and a plasma adjusting unit around the electrostatic chuck and to adjust a difference in a plasma density of plasma generated based on the bias power and the high frequency power between a center part and an outer peripheral part on the substrate.

According to another aspect of the inventive concept, there is provided a plasma processing apparatus including a process chamber having an interior in which plasma processing takes place, a substrate support disposed in the process chamber and including an electrostatic chuck having a support surface dedicated to support a substrate to be plasma processed, a gas supply system connected to the process chamber and which supplies a process gas into the process chamber, a plasma generator that transforms the process gas injected into the process chamber into plasma, and a plasma adjusting unit. The support surface of the substrate support occupies an axially central region of the interior of the process chamber. The plasma adjusting unit comprises a ring-shaped core of ferromagnetic material extending around the axially central region of the process chamber at a level proximate that of the substrate support surface, an insulator covering the core, and an auxiliary power source electrically coupled to the ring-shaped core of ferromagnetic material.

According to another aspect of the inventive concept, there is provided a method of manufacturing a semiconductor device, the method including mounting a substrate on an electrostatic chuck in a process chamber; injecting a process gas into the process chamber; and processing the substrate by transforming the process gas into plasma via a plasma processing apparatus including a plasma adjusting unit around the electrostatic chuck.

BRIEF DESCRIPTION OF THE DRAWINGS

The inventive concept will be more clearly understood from the following detailed description of examples thereof taken in conjunction with the accompanying drawings in which:

FIG. 3 is a schematic cross-sectional view of an example of a plasma processing apparatus, according to the inventive concept;

FIG. 14 is a flowchart of a method of manufacturing a semiconductor device using a plasma processing apparatus of the inventive concept.

DETAILED DESCRIPTION

Figure 1:
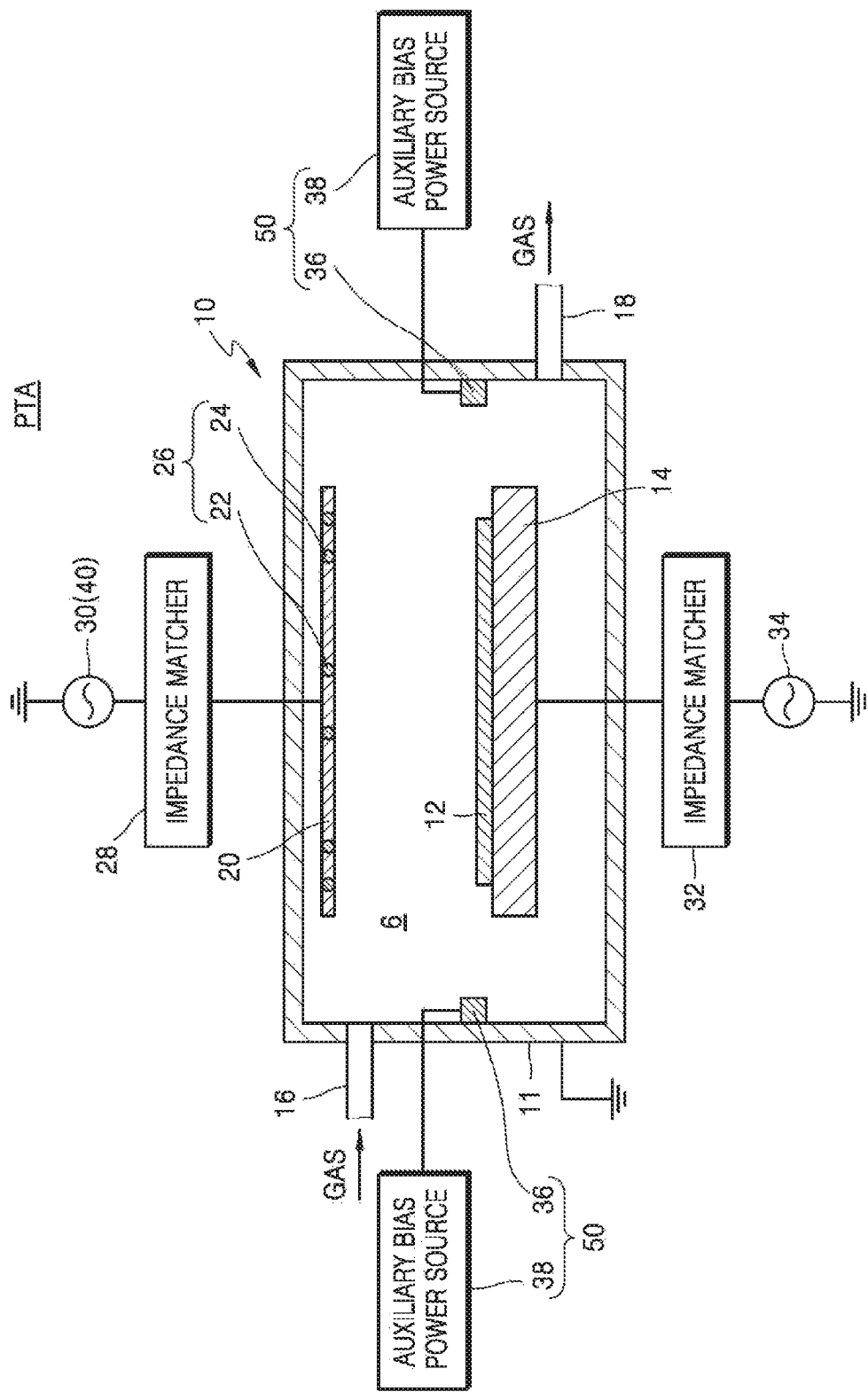
FIG. 1 is a schematic cross-sectional view of an example of a plasma processing apparatus, according to the inventive concept.
Figure 2A:
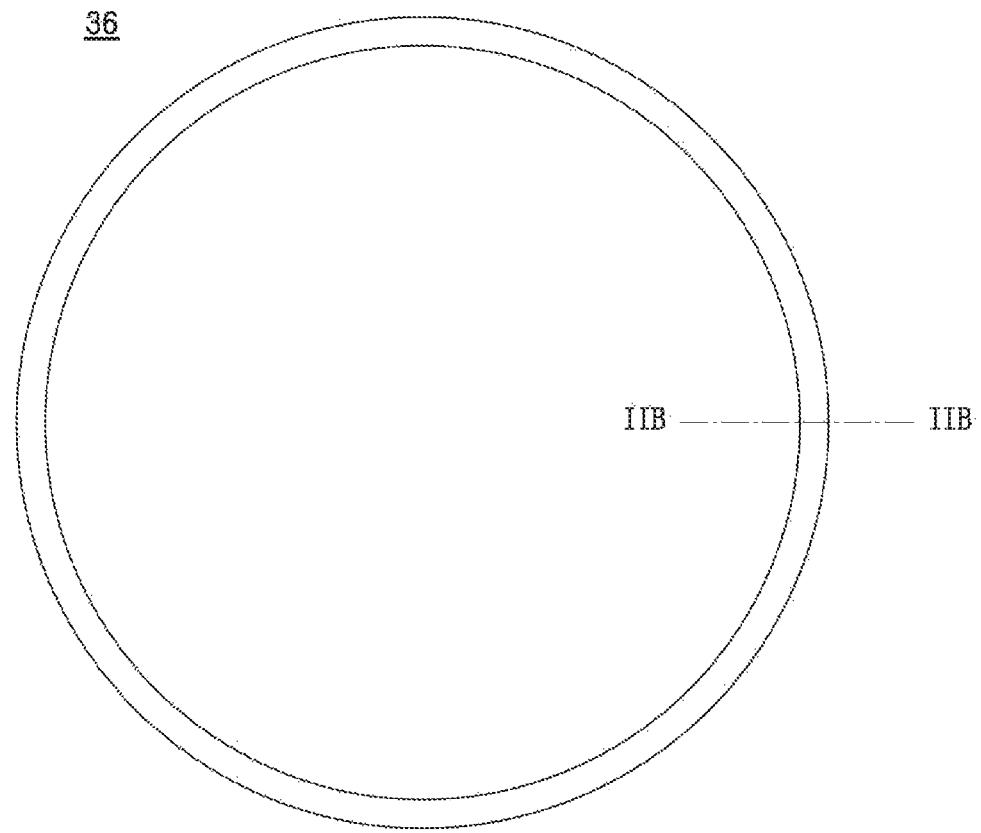
FIG. 2A is a plan view of a plasma adjusting unit of the plasma processing apparatus of FIG. 1.
Figure 2B:
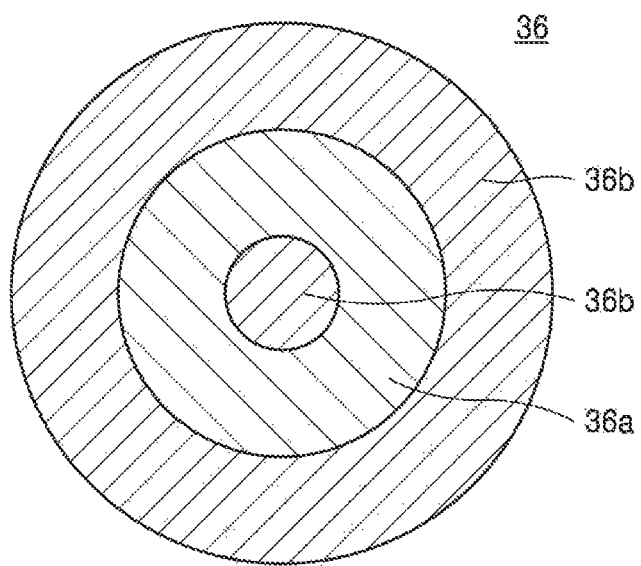
FIG. 2B is a cross-sectional view of the plasma adjusting unit taken along line IIB-IIB of FIG. 2A.

FIG. 1 is a schematic cross-sectional view of an example of a plasma processing apparatus PTA according to the inventive concept. FIG. 2A is a plan view of a plasma adjusting unit 50 of the plasma processing apparatus PTA. FIG. 2B is a cross-sectional view of plasma adjusting unit 50 taken along line IIB-IIB FIG. 2A.

Specifically, an inductively coupled plasma (ICP) etching or deposition apparatus is presented as an example of the plasma processing apparatus PTA. The plasma processing apparatus PTA includes a process chamber 10 in which a gas injection unit 16 and a gas discharge unit 18 are installed. The process chamber 10 may have an internal space 6. The inner space 6 may be a processing chamber in which plasma is processed. The process chamber 10 may be grounded. A process gas such as an etching gas or a deposition gas may be introduced into the process chamber 10 through the gas injection unit 16 and may be discharged to the outside through the gas discharge unit 18. The process chamber 10 may be maintained in a high vacuum state to prevent process defects that may be caused by contaminants such as particles during plasma reactions.

A high frequency electrode unit 26 and a substrate support comprising an electrostatic chuck 14 may also be installed in the process chamber 10. The high frequency electrode unit 26 and the electrostatic chuck 14 may be used as a first electrode and a second electrode, respectively, and may be installed to face each other. The high frequency electrode unit 26 may be installed on a dielectric window 20 at a top side of the process chamber 10. The high frequency electrode unit 26 may include high frequency antennas 22 and 24.

The high frequency antennas 22 and 24 may respectively comprise an internal antenna 22 corresponding to a center part of the substrate 12 and an external antenna 24 located outside the internal antenna 22 and corresponding to an outer peripheral part of the substrate 12. The high frequency electrode unit 26 may be connected to a high frequency power source 30 that supplies high frequency power, i.e., radio frequency (RF) power, through an impedance matcher 28.

The high frequency power supplied by the high frequency power source 30 may have a frequency of 27 MHz or more. For example, the high frequency power supplied by the high frequency power source 30 may have a frequency of 60 MHz. As the high frequency antennas 22 and 24 respectively comprise the internal antenna 22 and the external antenna 24, a plasma density on the substrate 12 may be uniform by precisely controlling a magnetic field.

The substrate 12, e.g., a wafer, may be mounted on the electrostatic chuck 14. The wafer may have a diameter of 300 mm. The wafer may be a silicon wafer. The electrostatic chuck 14 may be connected to a bias power source 34 that supplies high frequency power through an impedance matcher 32. The high frequency power supplied through the bias power source 34 may have a frequency between 100 KHz and 10 MHz. For example, the high frequency power supplied through the bias power source 34 may have a frequency of 2 MHz. The impedance matchers 28 and 32 may be omitted, if not necessary.

The process gas injected into the process chamber 10 may be transformed into plasma by a plasma generator 40 which may be referred to hereinafter as plasma application unit 40. The plasma application unit 40 may include the high frequency power source 30 electrically connected to the high frequency electrode unit 26. When power is applied to the high frequency electrode unit 26 by the high frequency power source 30, the process gas injected into the process chamber 10 may be transformed into plasma. When high frequency or low frequency power is applied to the electrostatic chuck 14 through the bias power source 34, the plasma generated in the process chamber 10 may be accelerated by the bias, i.e., guided, toward the substrate 12.

In the plasma processing apparatus PTA, the plasma adjusting unit 50 may be installed around the electrostatic chuck 14. The plasma adjusting unit 50 may adjust the density of plasma across the substrate 12, i.e., may adjust the distribution of the density of the plasma. The plasma density may influence an etch uniformity of film quality or deposition uniformity on the substrate 12. For example, if the plasma density across the substrate 12 is not uniform, an etching rate of the center part of the substrate 12 may be different from an etching rate of the outer peripheral part of the substrate 12.

The plasma adjusting unit 50 may include a body portion 36 located around the electrostatic chuck 14 and an auxiliary bias power source 38 electrically coupled to the body portion 36. The body portion 36 may be supported on an inner side wall surface 11 of the process chamber 10. The body portion 36 may have an annular or cylindrical shape as shown in FIG. 2A, i.e., the body portion 36 may be "ring-shaped". The body portion 36 may be considered, in general, as disposed radially outwardly of the support surface of the electrostatic chuck 14 at substantially the same level as the support surface. The term "at substantially the same level" will be understood as referring to the fact that the body portion 36 (described in more detail below) is vertically close enough to the support surface to significantly affect the density of plasma that will occur at or just above the support surface (and hence, at the surface of the substrate to be processed), under normal operating process parameters of the apparatus, for reasons that are also explained in more detail below.

The body portion 36 may include a ring-shaped ferromagnetic core 36*a* (which may be referred to hereinafter as a "core unit") and an insulator 36*b* (which may be referred to hereinafter as an "insulator coating unit") that covers (or surrounds) the ferromagnetic core unit 36*a* as shown in FIG. 2B. The ferromagnetic core unit 36*a* may be coated with an electrically insulating material to form the insulator coating unit 36*b*. In general, the support surface of the electrostatic chuck 14 may occupy an axially central region of the interior of the process chamber 10 and the ferromagnetic core unit 36*a* may extend around the axially central region of the process chamber 10 at a level proximate that of the support surface (i.e., at substantially the same level as the support surface).

The ferromagnetic core unit 36*a* may include a permalloy, supermalloy or super permalloy (sometimes referred to as super alloy permalloy) material. Permalloy may be a Ni (nickel)-Fe (iron) magnetic alloy. The permalloy of the ferromagnetic core unit 36*a* may have 60% to 90% of Ni and Fe as remainder. For example, the permalloy may include 78% Ni and 22% Fe. The supermalloy of the ferromagnetic core unit 36*a* may be a Ni (nickel)-Mo—Fe (iron) magnetic alloy. The supermalloy may include 79% Ni, 5% Mo, and Fe as remainder. The superpermalloy of the ferromagnetic core unit 36*a* may be 40-80% Ni, 6% and less Cr, 2% and less Si, 4% and less Sn and 16-60% Fe. Permalloy, supermalloy and super permalloy may be easily magnetized in a weak magnetic field and may each be an alloy having a high relative permeability of 400 to 10,000,000.

The insulator coating unit 36*b* may be an oxide such as an yttrium oxide layer ($Y_2O_3$) or an aluminum oxide layer ($Al_2O_3$). A magnetic field at the outer peripheral part of the substrate 12 may be adjusted when power, that is, a direct current voltage, is applied to the ferromagnetic core unit 36*a* of the body portion 36 through the auxiliary bias power source 38. The ferromagnetic core unit 36*a* is a magnetic body having a high relative permeability, and may serve to shield a magnetic effect, that is, a magnetic field.

Accordingly, the plasma adjusting unit 50 may control an electric field at the outer peripheral part of the substrate 12 (including the outer peripheral edge of the substrate) to adjust a plasma density difference between the center part and the outer peripheral part on the substrate 12. For example, the plasma adjusting unit 50 may lead to a uniform plasma density on the substrate 12, and thus the etching rate of the center part and the etching rate of the outer peripheral part on the substrate 12 may be substantially the same.

FIG. 3 is a schematic cross-sectional view of an example of a plasma processing apparatus PTA-1, according to the inventive concept.

Specifically, the plasma processing apparatus PTA-1 is similar to the plasma processing apparatus PTA of FIG. 1 except in that the high frequency electrode unit 26-1 is configured as a flat plate electrode, and electrostatic chuck 14 is grounded. In FIG. 3, the same reference numerals as in FIG. 1 denote the same members.

The plasma processing apparatus PTA-1 may be, for example, a capacitive coupled plasma (CCP) etching or a deposition apparatus. The plasma processing apparatus PTA-1 uses a flat plate electrode as the high frequency electrode unit 26-1. When power is supplied to the high frequency electrode unit 26-1 through the high frequency power source 30, a process gas injected into the process chamber 10 may be transformed into plasma. So, in this example, the plasma generator is constituted by power source 30 and flat plate electrode.

In the plasma processing apparatus PTA-1, the plasma adjusting unit 50 may be installed around the electrostatic chuck 14. The plasma processing apparatus PTA-1 may adjust an electric field at an outer peripheral part on the substrate 12 by supplying power, that is, a direct current voltage, to the body portion 36 via the auxiliary bias power source 38.

Accordingly, the plasma processing apparatus PTA-1 may control a plasma density difference between a center part and the outer peripheral part on the substrate 12. The plasma adjusting unit 50 may make an etching rate of the center part on the substrate 12 and an etching rate of the outer peripheral part or a deposition speed at the center part and the outer peripheral part almost the same.

Figure 4:
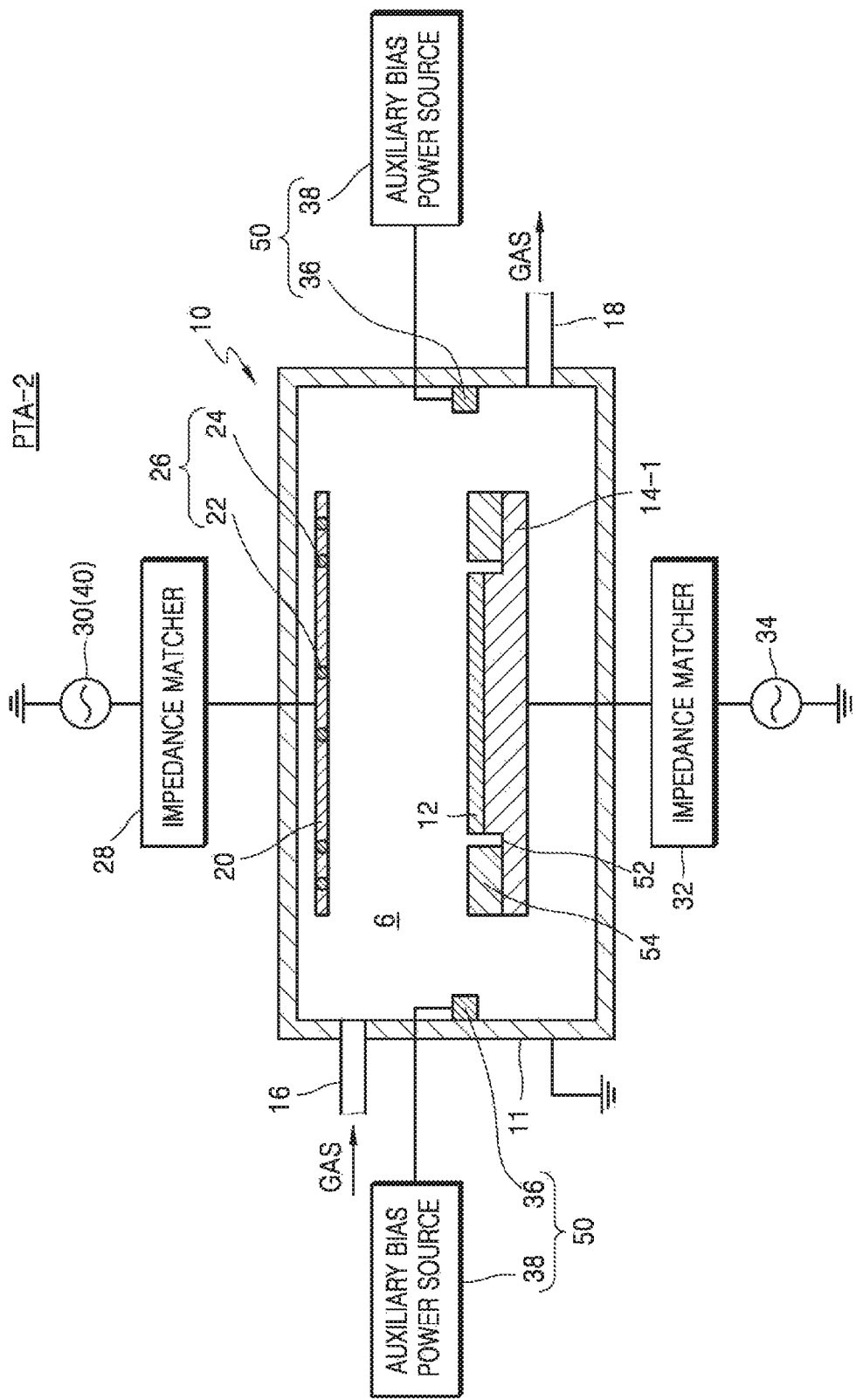
FIG. 4 is a schematic cross-sectional view of another example of a plasma processing apparatus according to the inventive concept.

FIG. 4 is FIG. 4 is a schematic cross-sectional view of another example of a plasma processing apparatus PTA-2 according to the inventive concept.

Specifically, the plasma processing apparatus PTA-2 is similar to the plasma processing apparatus PTA-1 of FIG. 1, except in that a focus unit 54 is installed at an outer peripheral part of substrate support comprising electrostatic chuck 14-1 apart from a surface of the electrostatic chuck, e.g., a substrate surface dedicated to receive and support the substrate 12. In FIG. 4, the same reference numerals as those in FIG. 1 denote the same members.

In the plasma processing apparatus PTA-2, the focus unit 54 may be installed around the substrate support surface/substrate 12 at the outer peripheral part of the substrate support. The focus unit 54 may be located apart from the substrate 12 and may be installed in an annular recess 52 in an upper portion of the outer peripheral part the substrate support. The focus unit 54 may be an annular or cylindrical member extending around the substrate 12 as spaced apart from the substrate 12. The focus unit 54 may be a focus ring.

The focus unit 54 may serve to adjust an electric field at an outer peripheral part of the substrate 12. The focus unit 54 may provide a uniform plasma density between a center part and the outer peripheral part of the substrate 12. In the plasma processing apparatus PTA-2, the plasma adjusting unit 50 may be installed around the electrostatic chuck 14-1.

The plasma processing apparatus PTA-2 may adjust a plasma density difference between the center part and the outer peripheral part on the substrate 12 due to the focus unit 54 and the plasma adjusting unit 50. For example, the plasma processing apparatus PTA-2 may make an etching rate of the center part on the substrate 12 or an etching rate of the outer peripheral part almost the same.

Figure 5:
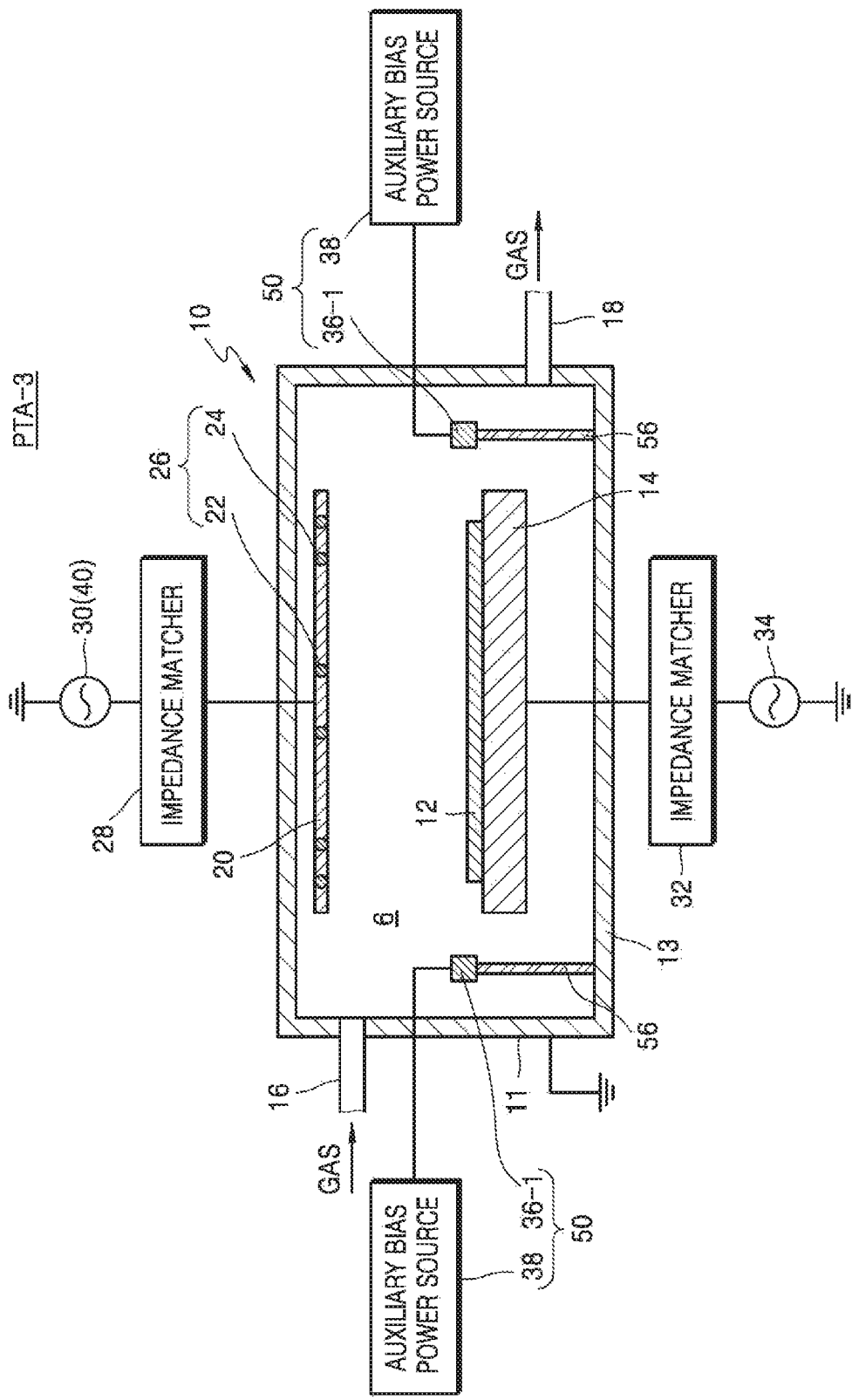
FIG. 5 is a schematic cross-sectional view of another example of a plasma processing apparatus according to the inventive concept.

FIG. 5 is a schematic cross-sectional view of another example of a plasma processing apparatus PTA-3 according to the inventive concept.

Specifically, the plasma processing apparatus PTA-3 is similar to the plasma processing apparatus PTA-1 of FIG. 1, except in that a body portion 36-1 constituting the plasma adjusting unit 50 is supported by a bottom portion 13 of the process chamber 10. In FIG. 5, the same reference numerals as those in FIG. 1 denote the same members.

In the plasma processing apparatus PTA-3, the body portion 36-1 constituting the plasma adjusting unit 50 may be supported by the bottom portion 13 of the process chamber 10 through a supporting member 56 or simply "support" mounted to a bottom portion of the process chamber 10. The body portion 36-1 may be more stably installed closer to the substrate support surface/substrate 12 when the body portion 36-1 is supported by the bottom portion 13 of the process chamber 10 via the supporting member 56.

The plasma processing apparatus PTA-3 may better adjust an electric field at an outer peripheral part on the substrate 12 by applying power, i.e., DC voltage, to the body portion 36-1 through an auxiliary bias power source 38. Accordingly, the plasma processing apparatus PTA-3 may better adjust a plasma density difference between a center part and the outer peripheral part on the substrate 12. For example, the plasma adjusting unit 50 may make an etching rate of the center part and an etching rate of the outer peripheral part on the substrate 12 almost the same.

Figure 6:
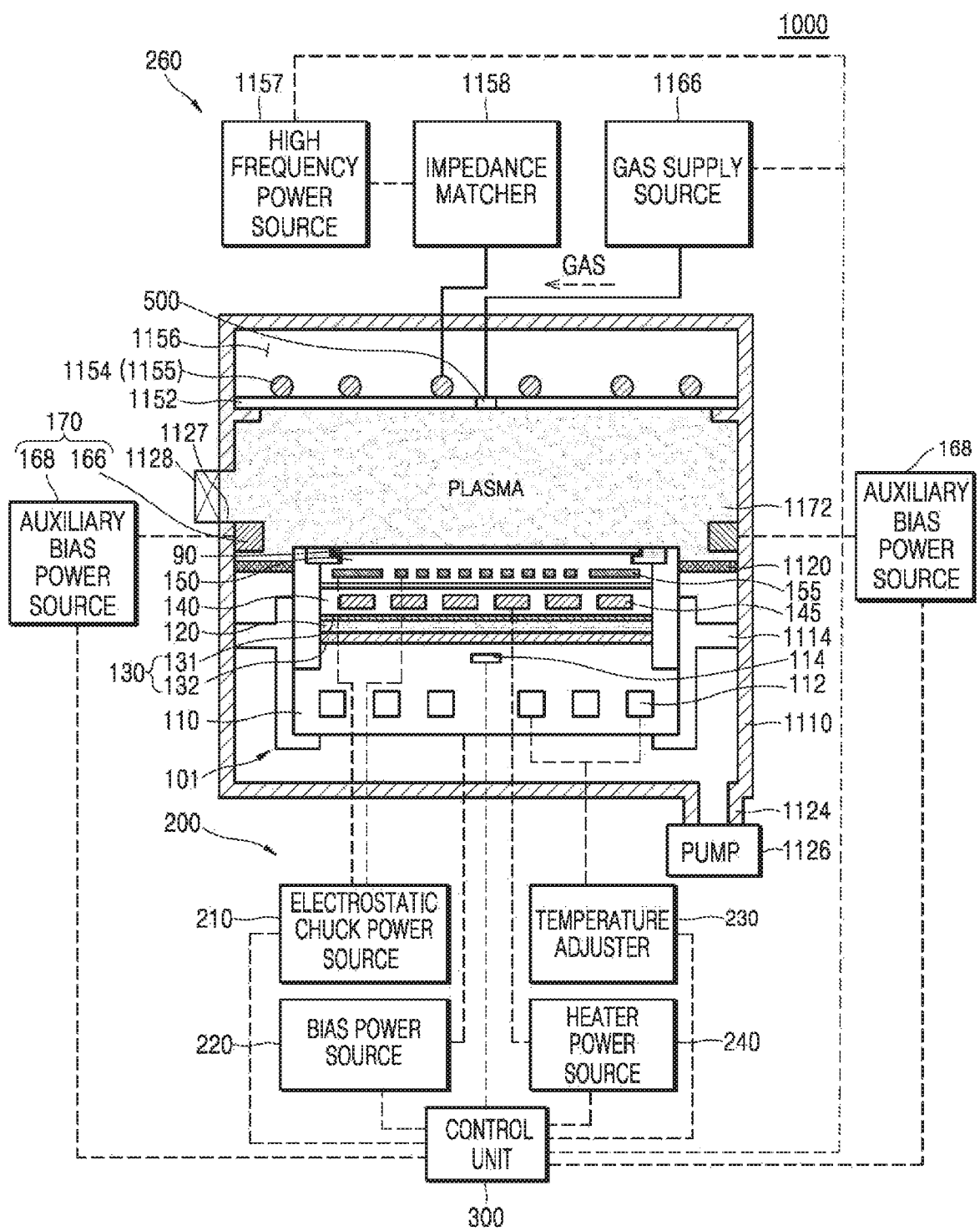
FIG. 6 is a schematic cross-sectional view of an example of a plasma processing apparatus according to the inventive concept.
Figure 7:
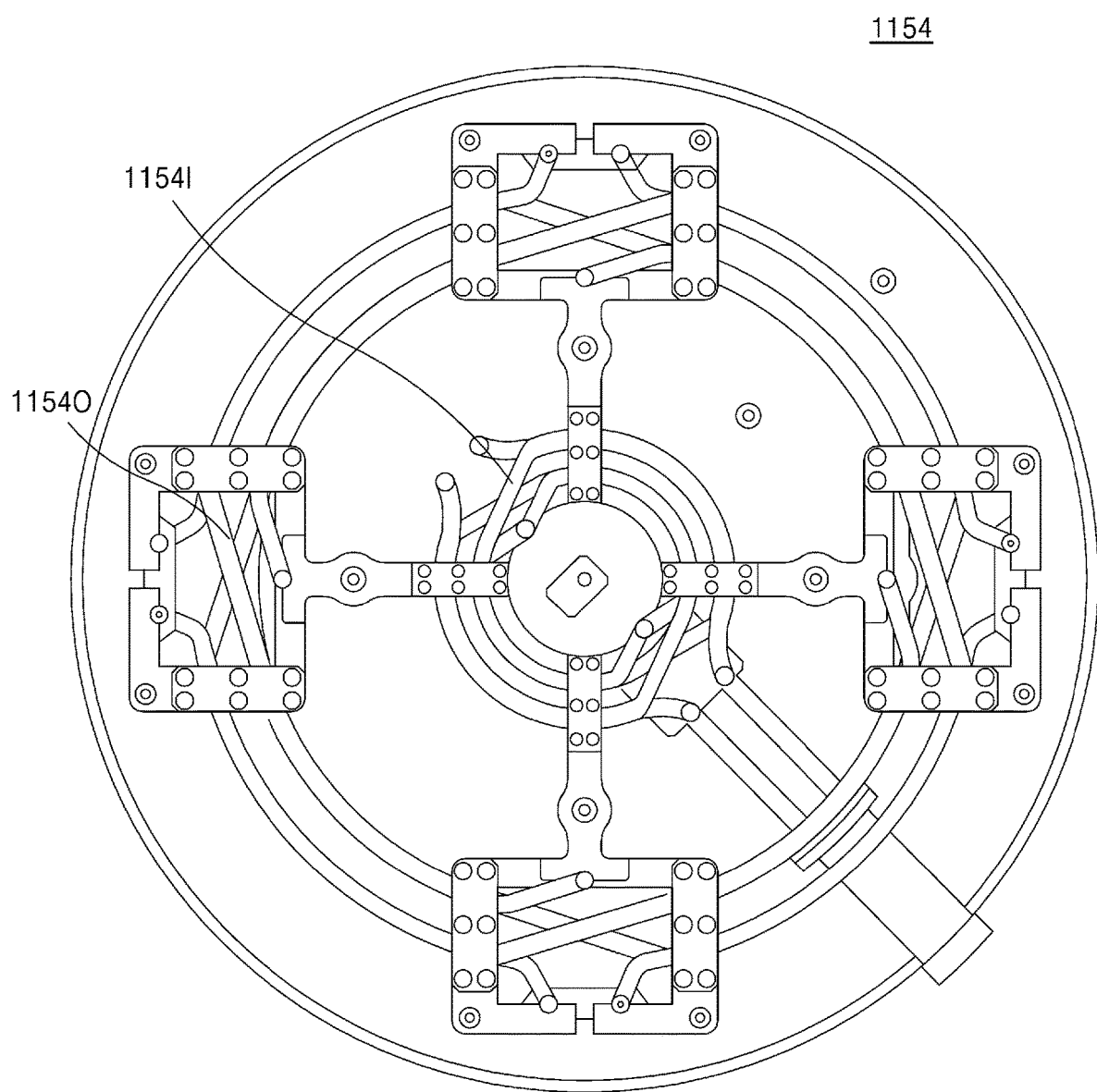
FIG. 7 is a plan view of a high frequency electrode unit of the plasma processing apparatus FIG. 6.

FIG. 6 is a schematic cross-sectional view of an example of a plasma processing apparatus 1000 according to the inventive concept. FIG. 7 is a plan view of a high frequency electrode unit 1155 of the plasma processing apparatus 1000 of FIG. 6.

As examples, the plasma processing apparatus 1000 may be an inductively coupled plasma (ICP) etching or deposition apparatus. The plasma processing apparatus 1000 may be similar to the plasma processing apparatus PTA schematically shown in and described with reference to FIGS. 1, 2A and 2B. However, the plasma processing apparatus 1000 of the inventive concept is not limited to an ICP etching or deposition apparatus. That is, various forms of plasma generators that transform the process gas into plasma may be employed.

The plasma processing apparatus 1000 may be an apparatus for processing a substrate 90, e.g., etching or depositing a thin film on the substrate, in a process chamber 1110 using plasma such as an ICP. The substrate 90 may be a wafer, such as a silicon wafer. A diameter of the wafer may be 300 mm. The process chamber 1110 may be a plasma chamber including an inner space. A film of material such as an oxide film or a nitride film may be formed on the substrate 90.

The plasma processing apparatus 1000 may include a substrate support 101 comprising an electrostatic chuck on which the substrate 90 is mounted in the process chamber 1110, a top gas injection unit 500 for injecting a process gas into the process chamber 1110, a plasma applying unit (plasma generator) 260 for exciting the process gas injected into the plasma processing apparatus 200 into a plasma, and a plasma adjusting unit 170 for controlling a plasma density. In other words, the plasma processing apparatus 1000 may include the electrostatic chuck 101, the top gas injecting unit 500, the plasma applying unit 260, the plasma adjusting unit 170, and the like. The plasma processing apparatus 1000 may include a controller (control unit) 300 that controls each component.

Examples of various components of the plasma processing apparatus 1000 will be described below in more detail. The substrate support 101 may include a base 110, a heater dielectric layer 140 bonded to the base 110 by an adhesive layer 130, and an electrostatic chuck including an electrostatic dielectric layer 150 and electrode 155 embedded in the electrostatic dielectric layer 150. The adhesive layer 130 may be a double-layer structure including a first adhesive 131 and a second adhesive 132. A metal plate 120 may be provided between the first adhesive 131 and the second adhesive 132. The base 110 may have a circular shape or a disc shape. The base 110 may include a metal such as aluminum (Al), titanium (Ti), stainless steel, tungsten (W), or an alloy thereof.

The inside of the process chamber 1110 in which the substrate support 101 is installed may be a high temperature environment and when the substrate 90 is exposed to a high temperature plasma, the substrate 90 may be damaged by ion bombardment, for example. There may be a need to cool the substrate 90 to avoid damage to the substrate 90 and for uniform plasma processing.

For cooling of the substrate 90, the base 110 may be provided with a coolant channel 112 through which cooling water flows. For example, cooling liquid may include water, ethylene glycol, silicone oil, liquid Teflon, a mixture of water and glycol. The coolant channel 112 may have a concentric or helical pipe structure with respect to a center axis of the base 110. The coolant channel 112 may be connected to a temperature adjuster 230 and the control unit 300. A flow rate and temperature of the cooling liquid circulating in the coolant channel 112 may be adjusted by the temperature controller 230 and the control unit 300.

The base 110 may be electrically connected to a bias power source 220. A high frequency or radio frequency may be applied by the bias power source 220 to the base 110. When high frequency power is applied to the base 110 by the bias power source 220, plasma generated in the process chamber 1110 may be further guided toward the substrate 90.

The base 110 may include a temperature sensor 114. The temperature sensor 114 may transmit a measured temperature of the base 110 to the control unit 300. A temperature of the electrostatic chuck 101 or a temperature of the substrate 90 may be predicted based on the temperature measured by the temperature sensor 114.

The heater dielectric layer 140 may include an embedded heater electrode 145. The heater dielectric layer 140 may include a dielectric such as a ceramic, e.g., an aluminum oxide layer ($Al_2O_3$), an aluminum nitride layer (AlN), an yttrium oxide layer ($Y_2O_3$) or a resin such as polyimide. The heater dielectric layer 140 may be circular or disc-shaped.

The heater electrode 145 may be formed of a metal such as tungsten (W), copper (Cu), nickel (Ni), molybdenum (Mo), titanium (Ti), nickel-chromium (Ni—Cr) alloy, nickel-aluminum (Ni—Al) alloy and the like or a conductive ceramic such as tungsten carbide (WC), molybdenum carbide (MoC), titanium nitride (TiN), and the like.

The heater electrode 145 may be electrically connected to the heater power source 240 and the control unit 300. The heater electrode 145 may be heated in response to power, e.g., AC voltage, from the heater power source 240 such that the temperatures of the electrostatic chuck 101 and the substrate 90 may be adjusted. The heater electrode 145 may have a concentric or helical pattern with respect to the center axis of the heater dielectric layer 140.

The electrode 155 embedded in the electrostatic dielectric layer 150 may be referred to as a clamp electrode. The electrostatic dielectric layer 150 may include a dielectric such as a ceramic, e.g., an aluminum oxide layer ($Al_2O_3$), an aluminum nitride layer (AlN), an yttrium oxide layer (Y2O3), or a resin such as polyimide. The electrostatic dielectric layer 150 may be circular or disc-shaped.

The substrate 90 may be disposed on the electrostatic dielectric layer 150 of the electrostatic chuck. The adsorption electrode 155 may be made of a conductive material, e.g., a metal such as tungsten (W), copper (Cu), nickel (Ni), molybdenum (Mo), titanium (Ti), nickel-chromium (Ni—Cr) alloy, nickel-aluminum (Ni—Al) alloy and the like or a conductive ceramic such as tungsten carbide (WC), molybdenum carbide (MoC), titanium nitride (TiN), and the like.

The adsorption electrode 155 may be electrically connected to a control unit 200 and an electrostatic chuck power source 210. An electrostatic force may be generated between the adsorption electrode 155 and the substrate 90 by power, e.g., DC voltage, applied by the electrostatic chuck power source 210 such that the substrate 90 may be attracted to the electrostatic dielectric layer 150.

The electrostatic chuck power source 210, the bias power source 220, the heater power source 240, and the temperature adjuster 230 may be controlled by the control unit 300. The control unit 300 may discern the temperatures of the substrate support 101 and the substrate 90 based on the temperature measured by the temperature sensor 114, and adjust the power of the heater power source 240 to thereby adjust the amount of heat generated by the heater electrode 145. Thus, the temperatures of the substrate 101 and the substrate 90 may be appropriately controlled.

The substrate support 101 may be supported by a support 1114 fixed to an inner wall surface of the process chamber 1110. A baffle plate 1120 may be provided between the substrate support 101 and the inner wall surface of the process chamber 1110. A gas discharge unit 1124 may be provided in a lower portion of the process chamber 1110 and may be connected to a vacuum pump 1126. A gate valve 1128 may be provided on an outer wall surface of the process chamber 1110 for opening and closing an opening 1127 through which the substrate 90 is taken in and out of the process chamber 1110.

In the plasma processing apparatus 1000, the plasma adjusting unit 170 may be installed around a top portion of the electrostatic chuck 101. The plasma adjusting unit 170 may include a body portion 166 disposed radially outwardly of as extending around the top portion of the electrostatic chuck 101 (at substantially the same level as the substrate support surface) and an auxiliary bias power source 168 electrically coupled to the body portion 166. The auxiliary bias power source 168 may be electrically connected to the control unit 300. The body portion 166 may be supported on the inner wall of the process chamber 1110. The body portion 166 may be cylindrical. The body portion 166 may be annular.

The body portion 166 may include the ferromagnetic core unit (36a in FIG. 2B) and the insulator coating unit (36b in FIG. 2B) as described with reference to FIGS. 1, 2A and 2B. The ferromagnetic core unit 36a may comprise a permalloy or super permalloy material including molybdenum. The insulator coating unit 36b may comprise an oxide. The ferromagnetic core unit 36a may be a magnetic material having a high relative permeability, and may serve to shield a magnetic effect, that is, a magnetic field, from outside the process chamber 1110. The magnetic field at an outer peripheral part of the substrate 90 may be adjusted by applying power, that is, DC voltage, to the ferromagnetic core unit 36a of the body portion 166 through the auxiliary bias power source 168.

A dielectric window 1152 spaced from the electrostatic chuck 101 may be provided on a ceiling of the process chamber 1110. An antenna chamber 1156 for receiving the high frequency electrode unit 1155 may be installed integrally with the process chamber 1110 above the dielectric window 1152. The high frequency electrode unit 1155 may include a high frequency antenna 1154 in the form of a coil having the shape of a spiral or concentric circles.

The high frequency antenna 1154 constituting the high frequency electrode unit 1155 may include an internal antenna 11541 corresponding to a center part of the substrate 90 and an external antenna 11540 located outside the internal antenna 11541 and corresponding to an outer peripheral part of the substrate 90 as shown in FIG. 7. When the high frequency antenna 1154 includes the internal antenna 11541 and the external antenna 11540, a plasma density on the substrate 90 may be uniformly controlled by more precisely controlling the magnetic field.

The high frequency electrode unit 1155 may be electrically connected to a high frequency power source 1157 via an impedance matcher 1158. The high frequency power source 1157 may output high frequency power suitable for generation of plasma. The impedance matcher 1158 may be provided for matching of impedance of the high frequency power source 1157 and load, e.g., impedance of the high frequency electrode unit 1155. The plasma applying unit 260 may include the high frequency power source 1157 electrically connected to the high frequency electrode unit 1155 and the impedance matcher 1158.

A gas supply source 1166 may inject the process gas through the top gas injecting unit 500. The gas supply source 1166 may inject the process gas through the top gas injecting unit 500, e.g., a hole, provided in the dielectric window 1152. Thus, the portion of the dielectric window 1152 may serve as a gas injector. The process gas may be an etching gas or a deposition gas. The gas supply source 1166 may be installed in a top portion of the process chamber.

The substrate 90 may be loaded (or mounted) on the electrostatic chuck of the substrate support 101 in the process chamber 1110 in order to perform etching processing using the plasma processing apparatus 1000. The substrate 90 may be secured to the electrostatic chuck by an electrostatic force generated by applying power from the electrostatic chuck power source 210 to the electrostatic chuck 101.

The process gas, such as an etch gas, may be introduced into the process chamber 1110 from the gas supply source 1166 via the top gas injecting unit 500. At this time, pressure in the process chamber 1110 may be set to a predetermined value by the vacuum pump 1126. Power may be applied from the high frequency power source 1157 to the high frequency electrode unit 1155 via the impedance matcher 1158. In addition, power may be applied to the base 110 from the bias power source 220.

The etch gas introduced into the process chamber 1110 may be uniformly diffused in a process chamber 1172 of the process chamber 1100 below the dielectric window 1152. A magnetic field may be generated around the high frequency electrode unit 1155 by current flowing in the high frequency electrode unit 1155 and magnetic field lines representative of the magnetic field may pass through the processing chamber 1172 through the dielectric window 1152. An induced electric field may be generated in the process chamber 1110 due to a temporal change of the magnetic field, and electrons accelerated by the induced electric field collide with molecules or atoms of the etch gas to generate plasma.

The plasma may be supplied to the substrate 90 by using the plasma applying unit 260 including the high frequency power source 1157 and the impedance matcher 1158 such that substrate processing, i.e., etching processing or deposition processing, may be performed in the processing chamber 1172. In order to precisely control the plasma generated in the process chamber 1172 of the process chamber 1110, the plasma processing apparatus 1000 of the inventive concept may include the plasma adjusting unit 170.

The plasma adjusting unit 170 may adjust a magnetic field at the outer peripheral part of the substrate and an electric field relating to the magnetic field to adjust a plasma density difference between the center part and the outer peripheral part on the substrate 90. For example, the plasma adjusting unit 170 may lead to a uniform plasma density on the substrate 90, and thus an etching rate of the center part and an etching rate of the outer peripheral part on the substrate 90 may be substantially the same.

Results of simulations of using the plasma processing apparatus shown in and described with FIGS. 6 and 7 will be described in detail with reference to FIGS. 8 to 12 below.

Figure 8A:
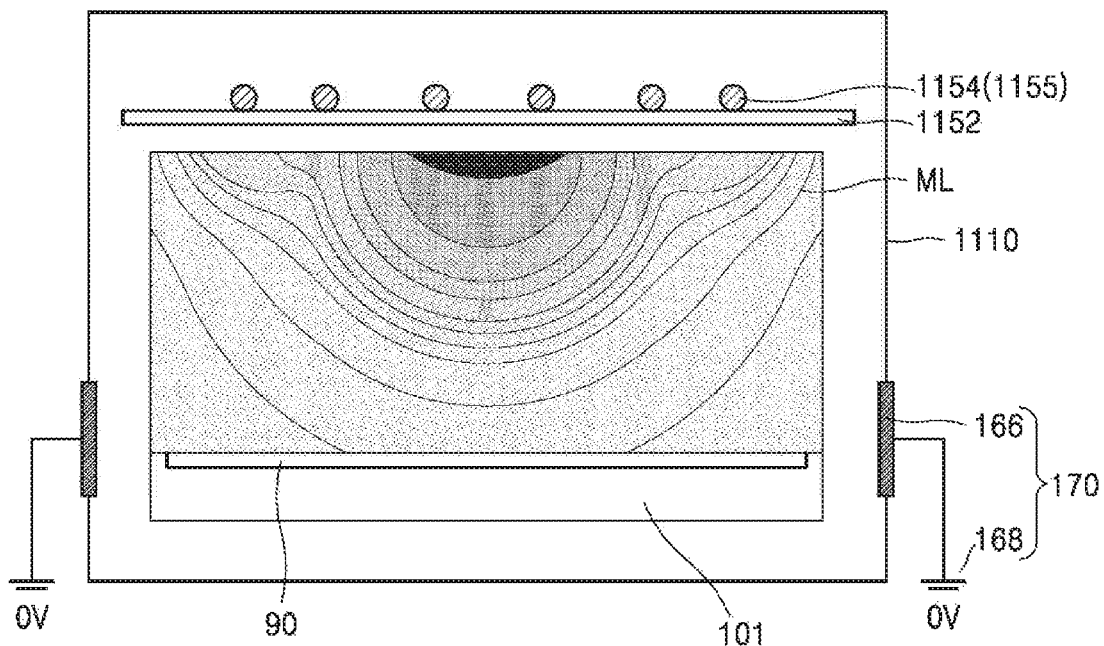
FIGS. 8A, 8B and 8C are diagrams of simulation showing a change in a magnetic field on an electrostatic chuck according to application of a DC voltage to a plasma adjusting unit of a plasma processing apparatus of the inventive concept.
Figure 8B:
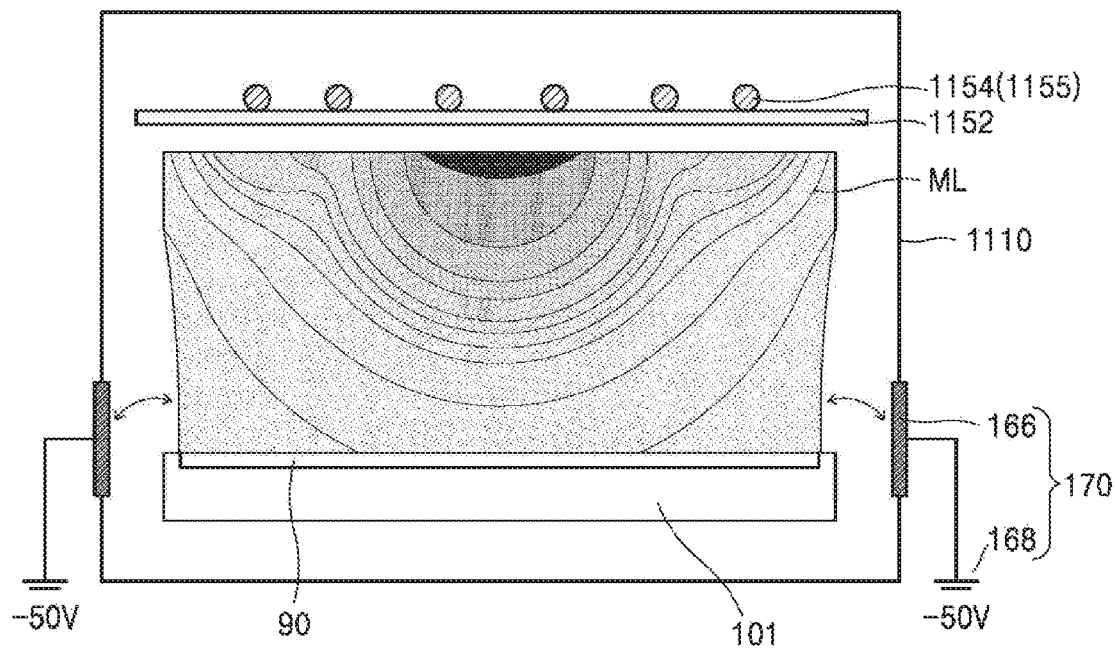
Figure 8C:
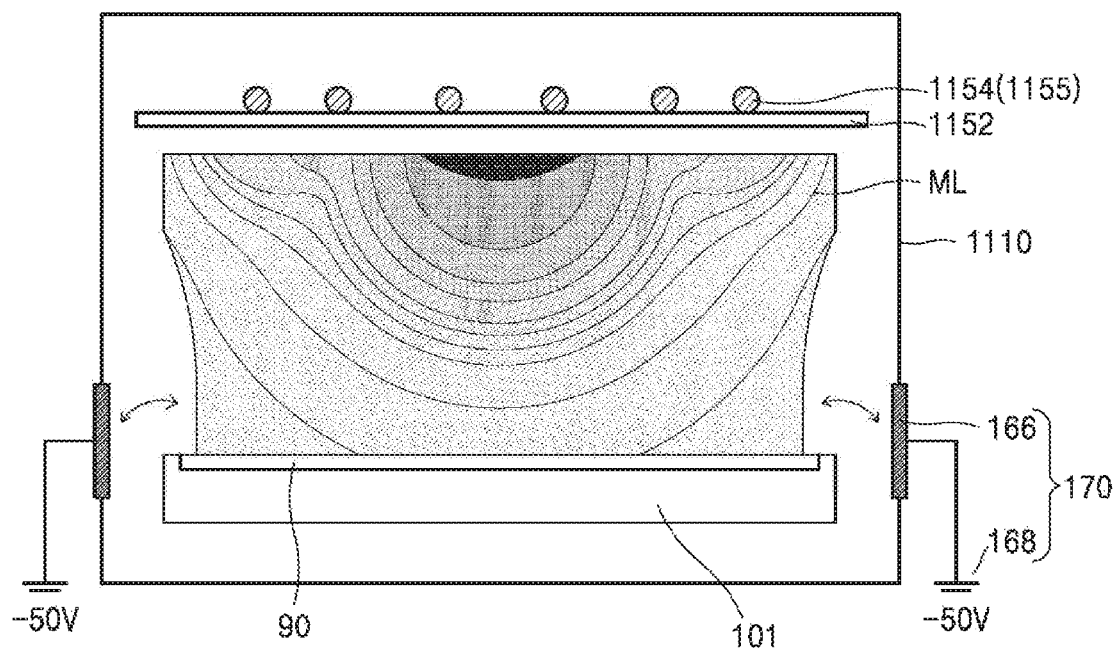
Figure 8D:
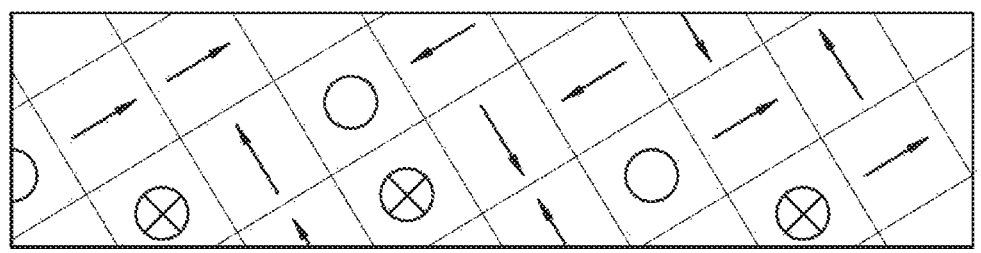
FIGS. 8D and 8E are conceptual diagrams showing a change in a magnetic domain of a ferromagnetic core unit constituting a body portion according to FIGS. 8A through 8C.
Figure 8E:
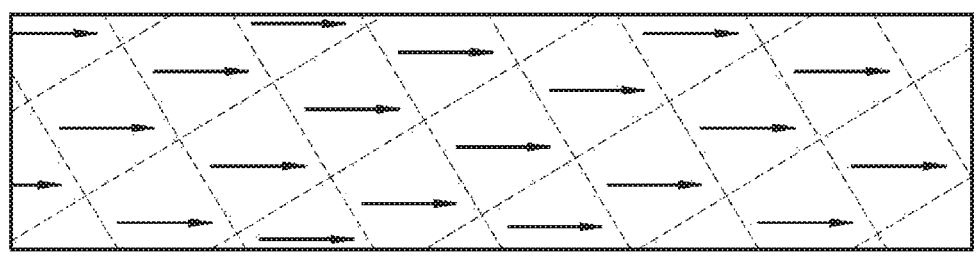

FIGS. 8A through 8C show the results of simulations showing a change in a magnetic field on an electrostatic chuck according to application of DC voltage to the plasma adjusting unit 170 of the plasma processing apparatus of the inventive concept. FIGS. 8D and 8E are diagrams showing a change in a magnetic domain of a ferromagnetic core unit constituting the body portion 166 in the simulations whose results are shown in FIGS. 8A through 8C.

Specifically, FIG. 8A shows the results of a simulation in which DC voltage is not applied to the body portion 166 of the plasma adjusting unit 170. FIGS. 8B and 8C show the results of simulations in which DC voltages of −50V and −100V are applied, respectively, by the auxiliary bias power source 168 to the body portion 166 of the plasma adjusting unit (170 of FIG. 6).

As shown in FIGS. 8A to 8C, the intensity of the magnetic field adjacent to the high frequency electrode unit 1155 located proximate the dielectric window 1152 is relatively high and the intensity of the magnetic field at a location remote from the high frequency electrode unit 1155 in a direction toward the electrostatic chuck 101 is relatively low. In FIGS. 8A to 8C, reference symbol ML denotes one of the magnetic lines of force of the magnetic field.

In addition, as shown in FIG. 8A, when the DC voltage is not applied to the body portion 166 of the plasma adjusting unit 170, the magnetic field on a surface of the electrostatic chuck 101, and hence, the magnetic field on a surface of the substrate 90, may be uniform and may not decrease. This is because a magnetic moment of the magnetic domain is formed in an irregular direction in the in the ferromagnetic core unit of the body portion 166 as shown in FIG. 8D and the body portion 166 does not shield the magnetic field.

To the contrary, as shown in FIGS. 8B and 8C, when the DC voltage is applied by the auxiliary bias power source 168 to the body portion 166 of the plasma adjusting unit 170, the magnetic field on a surface of the electrostatic chuck 101, and hence, the magnetic field on the surface of the substrate 90 may not be uniform and is shielded at an outer peripheral part. In particular, as shown in FIG. 8C, when the DC voltage is strongly applied to the body portion 166, the magnetic field on a surface of the electrostatic chuck 101, and hence, the magnetic field on the surface of the substrate 90, may be largely shielded at the outer peripheral part.

This is because the magnetic moment of the magnetic domain in the ferromagnetic core unit of the body portion 166 is regularly formed in one direction as shown in FIG. 8E and the body portion 166 shields the magnetic field.

As a result, the plasma processing apparatus of the inventive concept may include the plasma adjusting unit 170, and when the DC voltage is applied by the auxiliary bias power source 168 to the body portion 166 of the plasma adjusting unit 170, the range of the magnetic field across the surface of the electrostatic chuck 101 and the substrate 90 may be adjusted and likewise the range of the electric field associated with the magnetic field may be adjusted, resulting in a uniform plasma density.

Figure 9A:
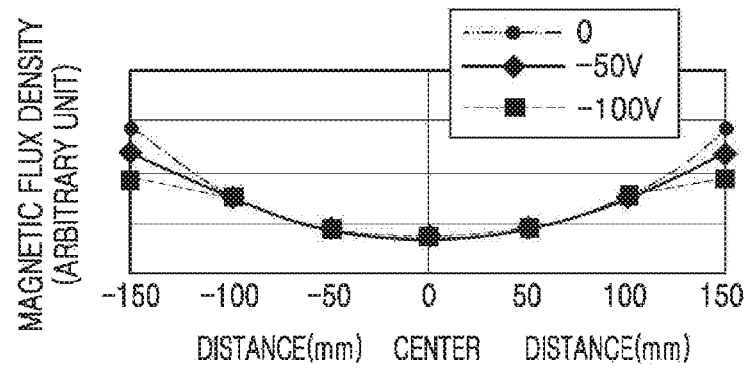
FIG. 9A is a graph showing a magnetic flux density according to a horizontal spacing distance from a center part of a substrate in simulated operations of plasma processing apparatus of the inventive concept.
Figure 9B:
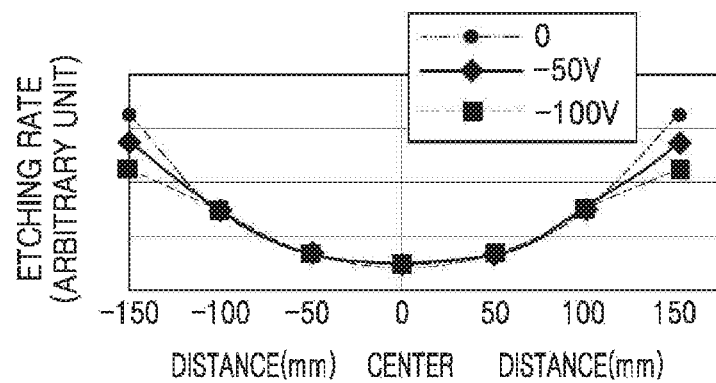
FIG. 9B is a graph showing an etching rate according to a horizontal spacing distance from a center part of a substrate in simulated operations of a plasma processing apparatus of the inventive concept.

FIG. 9A is a graph of results of a simulation showing magnetic flux density according to horizontal distance from a center part of a substrate in a plasma processing apparatus of the inventive concept. FIG. 9B is a graph of results of a simulation showing an etching rate according to horizontal distance from a center part of a substrate in a plasma processing apparatus of the inventive concept.

Specifically, in FIGS. 9A and 9B, "0" on an X axis represents the center part of the substrate having a diameter of 300 mm, and "150" and "−150" represents outer peripheral parts of the substrate at ends of the diameter of the substrate. The values along the X axis represent the horizontal spacing or distance from the center part of the substrate. When DC voltage is not applied to a ferromagnetic core unit of the body portion 166 of the plasma adjusting unit 170 as shown by plot --●-- in FIG. 9A, a difference in the magnetic flux density between the center part and the outer peripheral parts of the substrate is great.

On the other hand, when a DC voltage is applied to the ferromagnetic core unit of the body portion 166 of the plasma adjusting unit 170 as shown by plots ••■•• and -♦- of FIG. 9A, the difference in the magnetic flux density between the center part and the outer peripheral parts of the substrate is not greater than when DC voltage is not applied to the ferromagnetic core unit.

In addition, when the DC voltage is not applied to the ferromagnetic core unit of the body portion 166 of the plasma adjusting unit 170 as shown by plot --●-- in FIG. 9B, a difference in the etching rate between the center part and the outer peripheral parts of the substrate is great.

On the other hand, when a DC voltage is applied to the ferromagnetic core unit of the body portion 166 of the plasma adjusting unit 170 as shown by plots ••■•• and -♦- of FIG. 9B, the difference in the etching rate between the center part and the outer peripheral parts of the substrate is not greater than when DC voltage is not applied to the ferromagnetic core unit.

Because the plasma processing apparatus of the inventive concept includes the plasma adjusting unit (e.g., 170 of FIG. 6), when the DC voltage is applied to the body portion 166 of the plasma adjusting unit 170, a uniform plasma density may be sustained. As a result, a difference in the magnetic flux density or the etching rate between the center part and the outer peripheral parts of the substrate may be minimized.

Figure 10:
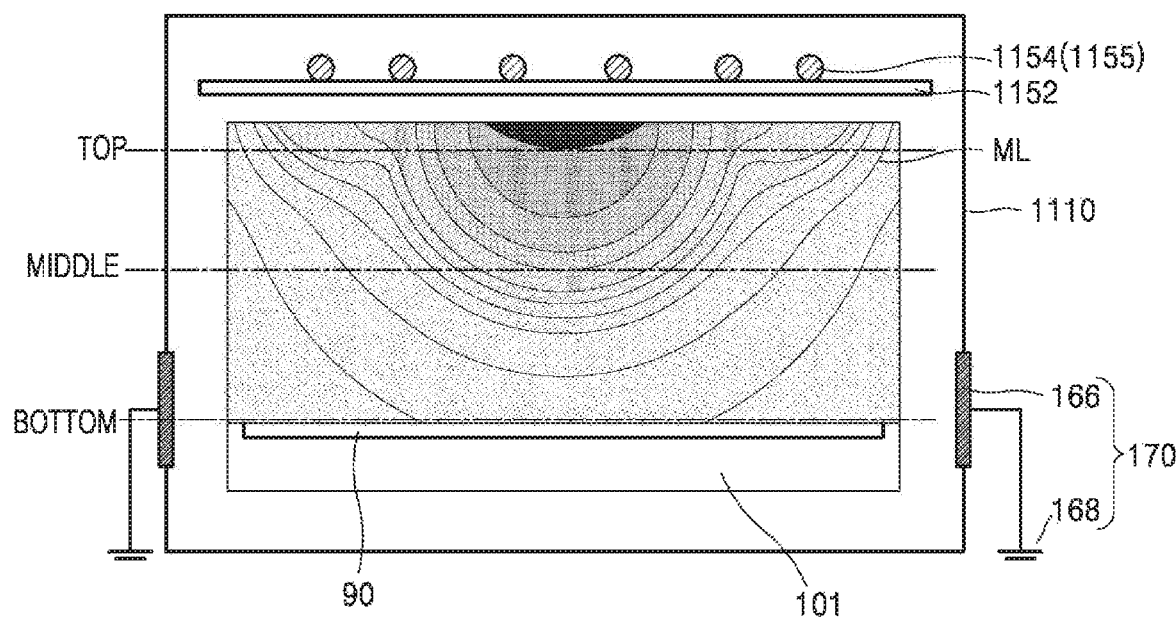
FIG. 10 is a conceptual diagram illustrating a magnetic flux density in vertical and horizontal directions with respect to a surface of a substrate in a plasma processing apparatus of the inventive concept.
Figure 11A:
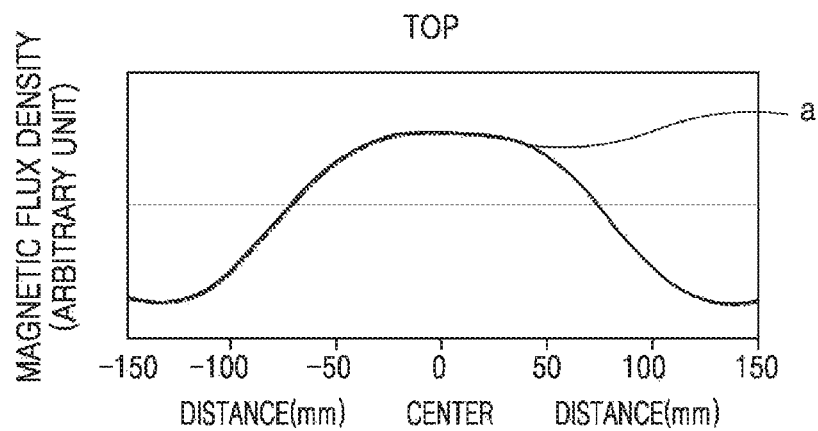
FIGS. 11A, 11B and 11C are graphs showing a magnetic flux density according to horizontal distance from a center part of a substrate and vertical distance from a surface of the substrate in simulated operations of a plasma processing apparatus of the inventive concept.
Figure 11B:
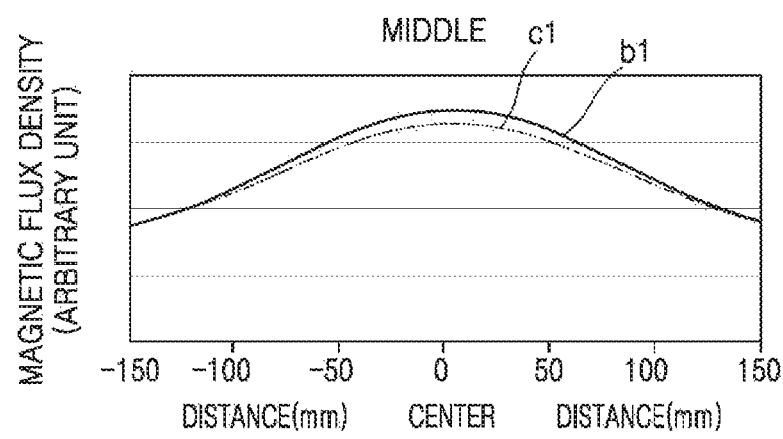
Figure 11C:
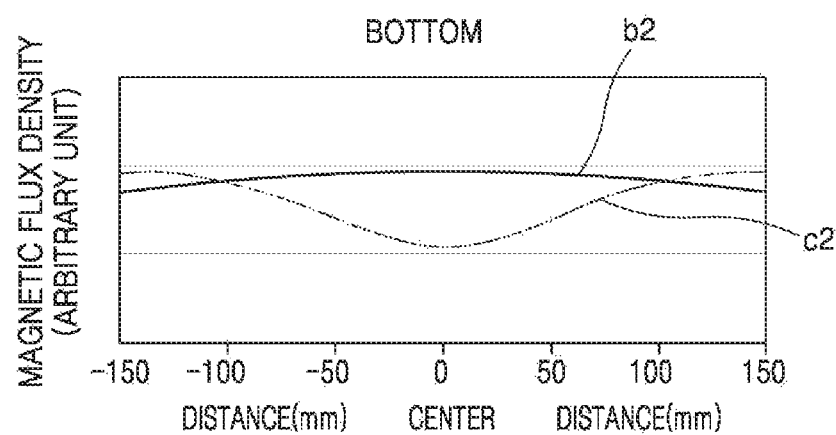

FIG. 10 is a diagram illustrating a magnetic flux density in vertical and horizontal directions relative to a horizontal (top) surface of the substrate 90 in a plasma processing apparatus of the inventive concept. FIGS. 11A through 11C are graphs of results showing a magnetic flux density according to horizontal distance from a center part of the substrate 90 and according to vertical distance from the surface of the substrate 90 obtained from simulations of the operation of a plasma processing apparatus of the inventive concept.

Specifically, in FIG. 10, a bottom portion BOTTOM, a middle portion MIDDLE, and a top portion TOP are respective horizontal planes in the processing chamber as spaced from each other in the vertical direction from the surface of the substrate 90 on the electrostatic chuck 101 of the plasma processing apparatus. In FIG. 10, the same reference numerals as those in FIGS. 8A to 8C denote the same members.

FIGS. 11A to 11C illustrate the magnetic flux density according to the horizontal distance from the center part of the substrate 90 at the top portion TOP, the middle portion MIDDLE and the bottom portion BOTTOM of the processing chamber in the vertical direction from the surface of the substrate 90 on the electrostatic chuck 101 of the plasma processing apparatus of FIG. 10, respectively.

In FIGS. 11A to 11C, "0" on the X axis represents the center part of the substrate 90 having a diameter of 300 mm, and "150" and "−150" represents points on the outer peripheral edge of the substrate 90 opposite one another along the diameter of the substrate. The distance represents the horizontal spacing from the center part of the substrate 90.

As shown in FIG. 11A, the top portion TOP in the vertical direction from the surface of the substrate 90 on the electrostatic chuck 101 may have a high magnetic flux density at the center part of the substrate 90 and a low magnetic flux density at the outer peripheral parts thereof as indicated by the plot denoted by reference character "a".

As shown in FIG. 11B, the middle portion MIDDLE in the vertical direction from the surface of the substrate 90 on the electrostatic chuck 101 may have a high magnetic flux density at the center part of the substrate 90 and a low magnetic flux density at the outer peripheral parts thereof as indicated by the plots denoted by reference characters "b1" and "c1".

Furthermore, even if DC voltage is applied to a ferromagnetic core unit of the body portion (166 in FIG. 6) constituting the plasma adjusting unit (170 in FIG. 6) as indicated by "b1" of FIG. 11, there may be a difference in the magnetic flux density between the center part and the outer peripheral parts of the substrate 90. The plot denoted by reference character "c1" of FIG. 1B illustrates a case in which no DC voltage is applied to the ferromagnetic core unit of the body portion 166.

As shown in FIG. 11C, the bottom portion BOTTOM in the vertical direction from the surface of the substrate 90 on the electrostatic chuck 101 may have a great difference in the magnetic flux density between the center part and the outer peripheral parts of the substrate 90 as indicated by the plot denoted by reference numeral "c2" when no DC voltage is applied to the ferromagnetic core unit of the body portion (166 in FIG. 6) constituting the plasma adjusting unit (170 in FIG. 6).

On the other hand, the bottom portion BOTTOM in the vertical direction from the surface of the substrate 90 on the electrostatic chuck 101 may have no great difference in the magnetic flux density between the center part and the outer peripheral parts of the substrate 90 as indicated by the plot denoted by reference numeral "b2" when the DC voltage is applied to the ferromagnetic core unit of the body portion (166 in FIG. 6) constituting the plasma adjusting unit (170 in FIG. 6).

Because a plasma processing apparatus of the inventive concept includes the plasma adjusting unit (e.g., 170 of FIG. 6), a difference in the magnetic flux density between the center part and the outer peripheral parts of the substrate 90 is minimized when the DC voltage is applied to the ferromagnetic core unit of the body portion 166 constituting the plasma adjusting unit 170. As a result, a uniform plasma density is observed across the substrate.

Figure 12A:
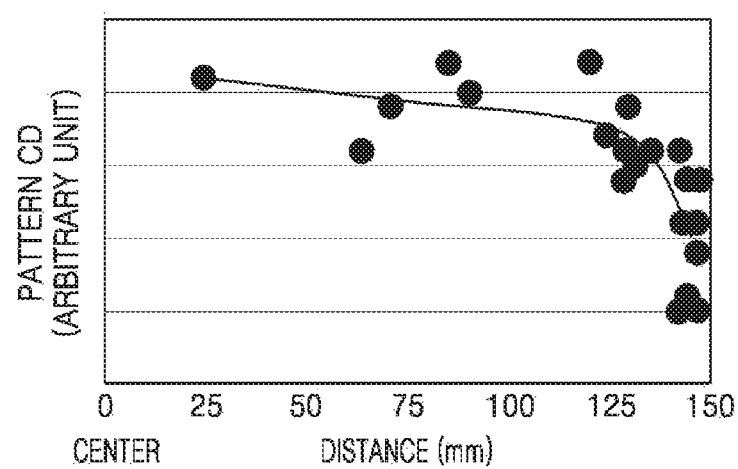
FIGS. 12A and 12B are graphs showing critical dimensions (CD) of patterns at a center part and an outer peripheral part of a substrate when plasma processing is performed using the plasma processing apparatus of FIGS. 6 and 7.
Figure 12B:
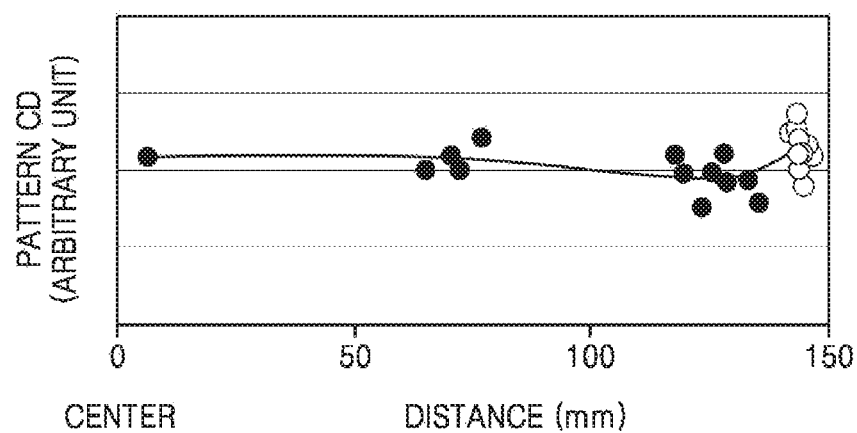

FIGS. 12A and 12B are graphs showing a critical dimension (CD) of patterns at a center part and an outer peripheral part of the substrate 90 formed by plasma processing using a plasma processing apparatus of FIGS. 6 and 7.

Specifically, FIGS. 12A and 12B illustrate the CD of patterns at the center part and the outer peripheral part of the substrate 90 when etching is performed using the plasma processing apparatus of FIGS. 6 and 7. In FIGS. 12A and 12B, "0" on the X axis represents the center part of the substrate 90 having a diameter of 300 mm, and "150" represents points at the outer periphery of the substrate 90 opposite one another along the diameter. The distance represents horizontal spacing from the center part of the substrate 90.

FIG. 12A shows a case in which no DC voltage is applied to a ferromagnetic core unit of the body portion 166 constituting the plasma adjusting unit (170 of FIG. 6). FIG. 12B shows cases in which DC voltages of −50V and −100V are applied to the ferromagnetic core unit of the body portion 166 constituting the plasma adjusting unit (170 of FIG. 6).

As shown in FIG. 12A, when no DC voltage is applied to the ferromagnetic core unit of the body portion 166 constituting the plasma adjusting unit (170 of FIG. 6), the pattern CD may decrease dramatically at the outer peripheral part of the substrate 90 in a direction towards the outer peripheral edge of the substrate 90.

On the other hand, as shown in FIG. 12B, when DC voltage is applied to the ferromagnetic core unit of the body portion 166 constituting the plasma adjusting unit (170 of FIG. 6), the pattern CD may not change (become smaller) in the outer peripheral part of the substrate 90.

Because the plasma processing apparatus of the inventive concept includes the plasma adjusting unit (e.g., 170 of FIG. 6), a difference in an etching rate between the center part and the outer peripheral part of the substrate 90 is minimized when the DC voltage is applied to the ferromagnetic core unit of the body portion 166 constituting the plasma adjusting unit (170 of FIG. 6).

Figure 13:
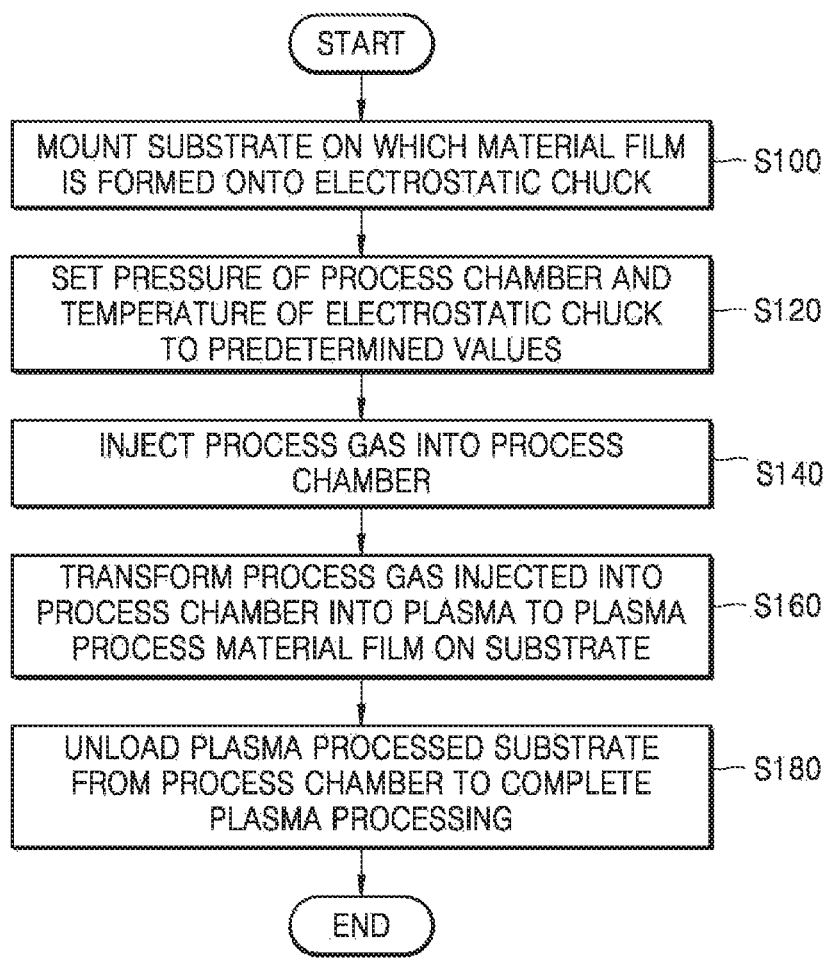
FIG. 13 is a flowchart of a plasma processing method executed by the plasma processing apparatus of FIG. 6.

FIG. 13 is a flowchart illustrating a plasma processing method using a plasma processing apparatus of FIG. 6.

Note, in describing the method illustrated by FIG. 13, the same reference numerals as those in FIG. 6 denote the same members. Thus, some of the same aspects of the operation that were already described in detail with respect to FIG. 6 will be only briefly described or omitted. The plasma processing method may include mounting (loading) the substrate 90 on which a material film, e.g., an oxide film or a nitride film is formed, onto the electrostatic chuck 101 in the process chamber 1110 (S100).

A pressure of the process chamber 1110 and a temperature of the electrostatic chuck 101 may be set to predetermined values (S120). The pressure of the process chamber 1110 and the temperature of the electrostatic chuck 101 may be some of the process parameters regulated by the control unit 300. The pressure of the process chamber 1110 and the temperature of the electrostatic chuck 101 may be changed during a plasma processing operation.

Subsequently, a process gas may be injected into the process chamber 1110 (S140). The process gas may be injected into the process chamber 1110 using the top gas injecting unit 500 at a controlled flow rate (another of the process parameters).

Subsequently, the process gas injected into the process chamber 1110 may be excited and thereby transformed into plasma to plasma process the material film on the substrate 90 (S160). The process gas injected into the process chamber 1110 may be transformed into plasma using the plasma applying unit 260 (plasma generator) as described above. The plasma processing may be a process of etching the material film formed on the substrate 90 or a process of forming a thin film. A plasma density between a center part and outer peripheral parts on the substrate 90 may be adjusted using the plasma adjusting unit 170 during plasma processing.

The plasma applying unit 260 may include the high frequency power source 1157. The plasma applying unit 260 may further include the impedance matcher 1158. The plasma adjusting unit 170 may include the body portion 166 disposed around a top portion of the substrate support 101 including electrostatic chuck and the auxiliary bias power source 168 electrically coupled to the body portion 166. The power (power values) applied by the high frequency power source 1157 of the plasma applying unit 260 and the auxiliary bias power source 168 of the plasma adjusting unit 170 may constitute the process parameters.

As mentioned above, the process parameters may be controlled using the control unit 300 during one or a series of processes of plasma processing. The control unit 300 may control at least one process parameter which again, as mentioned above, include the pressure in the process chamber 1110, the temperature of the electrostatic chuck, the flow rate of the process gas supplied from the top gas injection unit 500, and the power supplied by the plasma applying unit 260 or the plasma adjusting unit 170. Subsequently, the plasma processed substrate 90 may be unloaded from the process chamber 1110 to complete plasma processing (S180).

FIG. 14 is a flowchart illustrating a method of manufacturing a semiconductor device using a plasma processing apparatus of the inventive concept.

For convenience, the method of manufacturing the semiconductor device using the plasma processing apparatus 1000 of FIG. 6 will be described. Thus, when describing the method illustrated by FIG. 14, the same reference numerals as those in FIG. 6 denote the same members. Accordingly, some of the same aspects of the operation that were already described in detail with respect to FIG. 6 will be only briefly described or omitted.

The method of manufacturing the semiconductor device may include mounting (loading) the substrate 90 onto the electrostatic chuck of the substrate support 101 in the process chamber 1110 (S200). A pressure of the process chamber 1110 and a temperature of the electrostatic chuck 101 may be set to predetermined values (S220). The pressure of the process chamber 1110 and the temperature of the electrostatic chuck 101 may be some of the process parameters controlled by the control unit 300. The pressure of the process chamber 1110 and the temperature of the electrostatic chuck 101 may be changed during a substrate processing process Then, a process gas may be injected into the process chamber 1110 (S240). The process gas may be injected using the top gas injection unit 500 at a controlled flow rate (another of the process parameters). The process gas may be an etching gas or a deposition gas (i.e., a thin film forming gas).

Subsequently, the substrate 90 may be processed by exciting the process gas, i.e., by transforming the process gas, into plasma using the plasma processing apparatus provided with the plasma adjusting unit 170 around the electrostatic chuck 101 (S260). The process gas injected into the process chamber 1110 may be transformed into plasma by the plasma applying unit 260 (plasma generator). The plasma applying unit 260 may include the high frequency power source 1157. The plasma applying unit 260 may further include the impedance matcher 1158.

Processing of the substrate 90 may include forming a thin film layer on the substrate 90 mounted within the process chamber 1110 or etching a material film formed on the substrate 90. In other words, processing of the substrate 90 may be a deposition process for depositing a thin film, e.g., an oxide or nitride film, on the substrate 90. Processing of the substrate 90 may be an etching process for etching the material film formed on the substrate 90, e.g., an oxide film or a nitride film.

Processing of the substrate 90 may include adjusting the plasma density across the substrate 90 using the plasma adjusting unit 170 to, for example, reduce a difference in the plasma density between a center part and outer peripheral parts of the substrate 90. The plasma adjusting unit 170 may include the body portion 166 located around the electrostatic chuck 101 and the auxiliary bias power source 168 electrically connected to the body portion 166.

The plasma adjusting unit 170 may include the cylindrical ferromagnetic core unit (36a in FIG. 2B), the insulator coating unit (36b in FIG. 2B) coating and surrounding the ferromagnetic core unit, and the auxiliary bias power source 168 electrically connected to the ferromagnetic core unit. DC voltage may be applied to the ferromagnetic core unit through the auxiliary bias power source 168 to adjust a magnetic field between the center part and the outer peripheral parts on the substrate 90.

Subsequently, the completely processed substrate 90 may be unloaded from the process chamber 1110 to complete the method of manufacturing the semiconductor device (S280).

Although the inventive concept has been particularly shown and described with reference to examples thereof, it will be understood that various changes in form and details may be made thereto without departing from the spirit and scope of the following claims.

What is claimed is:

1. A plasma processing apparatus comprising:
   a process chamber having an interior in which plasma processing takes place;
   a substrate support disposed in the process chamber, the substrate support including an electrostatic chuck having a support surface dedicated to support a substrate to be plasma processed;
   a gas injector open to the interior of the process chamber so as to inject a process gas into the process chamber;
   a plasma generator that generates a magnetic field that transforms the process gas injected into the process chamber into plasma; and
   a plasma adjusting unit including a body comprising ferromagnetic material disposed radially outwardly of the support surface of the electrostatic chuck around the electrostatic chuck and the substrate, and an auxiliary power source electrically coupled to the body,
   wherein the body shields the magnetic field at the substrate responsive to the auxiliary power source, and
   wherein the plasma generator comprises a high frequency electrode unit comprising at least one electrode including a high frequency antenna.

2. The plasma processing apparatus of claim 1, further comprising a high frequency power source electrically connected to the at least one electrode of the high frequency electrode unit.

3. The plasma processing apparatus of claim 1, further comprising a bias power source electrically connected to the electrostatic chuck.

4. The plasma processing apparatus of claim 1, wherein the body of the plasma adjusting unit is annular or cylindrical.

5. The plasma processing apparatus of claim 4, wherein the body is supported on an inner side wall surface of the process chamber.

6. The plasma processing apparatus of claim 4, further comprising a support extending from a bottom portion of the process chamber, wherein the body is fixed to the support so as to be supported by the bottom portion of the process chamber via the support.

7. The plasma processing apparatus of claim 4, wherein the body comprises a core of said ferromagnetic material and an insulator covering the core.

8. The plasma processing apparatus of claim 7, wherein the core comprises a permalloy, supermalloy or super permalloy material, and the insulator comprises an oxide.

9. The plasma processing apparatus of claim 1, further comprising a focus unit to adjust an electric field at an outer peripheral part of the electrostatic chuck.

10. The plasma processing apparatus of claim 1, wherein the body of the plasma adjusting unit is disposed at substantially a same level as the support surface of the electrostatic chuck.

11. A plasma processing apparatus comprising:
a process chamber having an interior in which plasma processing takes place;
a substrate support comprising an electrostatic chuck disposed in a lower part of the process chamber, the electrostatic chuck having a support surface dedicated to support a substrate to be plasma processed;
a bias power source electrically connected to the electrostatic chuck;
a gas injector open to the interior of the process so as to inject a process gas into the process chamber;
a high frequency power source;
a high frequency electrode unit disposed in an upper part of the process chamber and comprising at least one electrode including a high frequency antenna that generates a magnetic field that transforms the process gas into plasma responsive to the high frequency power source; and
a plasma adjusting unit including a body comprising ferromagnetic material disposed radially outwardly of the support surface of the electrostatic chuck around the electrostatic chuck and the substrate, and an auxiliary power source electrically coupled to the body,
wherein the body shields the magnetic field at a peripheral part of the substrate responsive to the auxiliary power source; and
a control unit to which the bias power source, the high frequency power source and the auxiliary power source are electrically connected and operative to adjust a distribution of density of the plasma in the process chamber.

12. The plasma processing apparatus of claim 11, wherein the body of the plasma adjusting unit is annular or cylindrical.

13. The plasma processing apparatus of claim 12, wherein the body is supported on an inner side wall surface of the process chamber.

14. The plasma processing apparatus of claim 12, further comprising a support extending from a bottom portion of the process chamber, wherein the body is fixed to the support so as to be supported by the bottom portion of the process chamber via the support.

15. The plasma processing apparatus of claim 12, wherein the body comprises a core of said ferromagnetic material and an insulator covering the core, the ferromagnetic material of the core comprises a permalloy, supermalloy or super permalloy material, and the insulator comprises an oxide.

16. A plasma processing apparatus comprising:
a process chamber having an interior in which plasma processing takes place;
a substrate support disposed in the process chamber, the substrate support including an electrostatic chuck having a support surface dedicated to support a substrate to be plasma processed, the support surface occupying an axially central region of the interior of the process chamber;
a gas supply system connected to the process chamber and which supplies a process gas into the process chamber;
a plasma generator that transforms the process gas injected into the process chamber into plasma; and
a plasma adjusting unit comprising a ring-shaped core of ferromagnetic material extending around the axially central region of the process chamber spaced apart from the substrate support and at a level proximate that of the support surface of the electrostatic chuck, an insulator covering the ring-shaped core of ferromagnetic material, and an auxiliary power source electrically coupled to the ring-shaped core of ferromagnetic material,
wherein the ring-shaped core of ferromagnetic material adjusts density of the plasma responsive to the auxiliary power source, and
wherein the plasma generator comprises a high frequency electrode unit comprising at least one electrode including a high frequency antenna.

17. The plasma processing apparatus of claim 16, wherein the ferromagnetic material is a permalloy or super permalloy material.

18. The plasma processing apparatus of claim 16, further comprising a high frequency power source electrically connected to the at least one electrode of the high frequency electrode unit, and a bias power source electrically connected to the electrostatic chuck.

19. The plasma processing apparatus of claim 16, wherein the high frequency antenna comprises an internal antenna corresponding to a central part of the substrate, and an external antenna located outside the internal antenna and corresponding to an outer peripheral part of the substrate.

20. The plasma processing apparatus of claim 16, wherein the plasma adjusting unit is supported on an inner wall of the process chamber or is supported on a bottom portion via a support member of the process chamber.

* * * * *